(12) United States Patent
Yoo et al.

(10) Patent No.: US 11,699,711 B2
(45) Date of Patent: Jul. 11, 2023

(54) IMAGE SENSING DEVICE

(71) Applicant: SK hynix Inc., Icheon-si (KR)

(72) Inventors: Ha Neul Yoo, Icheon-si (KR); Yun Hui Yang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 204 days.

(21) Appl. No.: 17/016,777

(22) Filed: Sep. 10, 2020

(65) Prior Publication Data
US 2021/0313371 A1 Oct. 7, 2021

(30) Foreign Application Priority Data
Apr. 6, 2020 (KR) .................. 10-2020-0041574

(51) Int. Cl.
*H01L 29/04* (2006.01)
*H01L 27/146* (2006.01)

(52) U.S. Cl.
CPC .............................. *H01L 27/14627* (2013.01)

(58) Field of Classification Search
None
See application file for complete search history.

(56) References Cited

U.S. PATENT DOCUMENTS

| | | | | |
|---|---|---|---|---|
| 6,617,189 B1 * | 9/2003 | Chen | ................. | H01L 27/14621 257/233 |
| 7,547,573 B2 * | 6/2009 | Wen | .................. | H01L 27/14623 438/57 |
| 7,785,917 B2 * | 8/2010 | Park | .................. | H01L 27/14636 257/E31.127 |
| 8,456,014 B2 | 6/2013 | Kobayashi et al. | | |
| 2002/0027228 A1 * | 3/2002 | Lee | .................... | H01L 27/14621 257/69 |
| 2005/0208692 A1 * | 9/2005 | Lee | ................... | H01L 27/14685 257/E27.132 |
| 2009/0302406 A1 * | 12/2009 | Gambino | .......... | H01L 27/14627 438/70 |

FOREIGN PATENT DOCUMENTS

KR 10-2011-0022573 A 3/2011

* cited by examiner

*Primary Examiner* — Ali Naraghi
(74) *Attorney, Agent, or Firm* — Perkins Coie LLP

(57) ABSTRACT

An image sensing device includes a semiconductor substrate, a material layer, a lens layer, and a lens capping layer. The semiconductor substrate includes a pixel region, which include a plurality of unit pixels, and a pixel-array peripheral region located outside of and peripheral to the pixel region. The material layer is disposed over the semiconductor substrate in the pixel region and the pixel-array peripheral region, and includes a first trench extending to a predetermined depth in the pixel-array peripheral region. The lens layer is disposed over the material layer in the pixel region and collects incident light into a unit pixel in the pixel region. The lens capping layer is disposed over the lens layer and the material layer and includes an edge region formed to fill the first trench.

19 Claims, 18 Drawing Sheets

IMAGE SENSING DEVICE

CROSS-REFERENCE TO RELATED APPLICATION

This patent document claims the priority and benefits of Korean patent application No. 10-2020-0041574, filed on Apr. 6, 2020, which is incorporated by reference in its entirety as part of the disclosure of this patent document.

TECHNICAL FIELD

The technology and implementations disclosed in this patent document generally relate to an image sensing device.

BACKGROUND

An image sensor is used in electronic devices to convert optical images into electrical signals. The recent development of automotive, medical, computer and communication industries is leading to an increase in demand for highly integrated, high-performance image sensors in various devices such as digital cameras, camcorders, personal communication systems (PCSs), game consoles, surveillance cameras, medical micro-cameras, and robots.

SUMMARY

Various embodiments of the disclosed technology relate to an image sensing device including a lens capping layer for preventing the flare phenomenon from occurring in a lens layer. In some implementations, the lens capping layer has a particular shape to avoid its structural failure.

In an embodiment of the disclosed technology, an image sensing device may include a semiconductor substrate structured to include a pixel region, which includes a plurality of unit pixels, and a pixel-array peripheral region located outside of and peripheral to the pixel region, a material layer disposed over the semiconductor substrate in the pixel region and the pixel-array peripheral region, and structured to include a first trench extending to a predetermined depth in the pixel-array peripheral region, a lens layer disposed over the material layer in the pixel region and structured as a lens for collecting incident light into a unit pixel in the pixel region, and a lens capping layer disposed over the lens layer and the material layer and structured to include an edge region formed to fill the first trench.

In another embodiment of the disclosed technology, an image sensing device may include a semiconductor substrate formed to include a pixel region, which includes a plurality of unit pixels, and a pixel-array peripheral region located outside the pixel region, an over-coating layer disposed over the semiconductor substrate in the pixel region and the pixel-array peripheral region, a lens layer disposed over the over-coating layer in the pixel region, and a lens capping layer disposed over the lens layer and the over-coating layer, and structured to include regions extending inside the over-coating layer in the pixel-array peripheral region.

In another embodiment of the disclosed technology, an image sensing device may include a plurality of imaging pixels structured to convert optical images to electrical signals, a material layer disposed over the plurality of imaging pixels and extending to outside the imaging pixel array, a lens layer including a plurality of lenses disposed over the material layer and structured to converge light onto the plurality of imaging pixels, and a lens capping layer including a first portion and a second portion, the first portion being disposed over the lens layer, the second portion extending from the first portion and being vertically elongated in the material layer formed outside the imaging pixel array.

In another embodiment of the disclosed technology, an image sensing device may include an image sensing device may include a semiconductor substrate formed to include a pixel region provided with a plurality of unit pixels and a pixel-array peripheral region located at an outer wall of the pixel region, an over-coating layer disposed over the semiconductor substrate in the pixel region and the pixel-array peripheral region, and configured to include a first trench etched to a predetermined depth in the pixel-array peripheral region, a lens layer disposed over the over-coating layer in the pixel region, and a lens capping layer disposed over the lens layer and the over-coating layer, and configured in a manner that an edge region of the lens capping layer is formed to fill the first trench.

In another embodiment of the disclosed technology, an image sensing device may include an image sensing device may include a semiconductor substrate formed to include a pixel region provided with a plurality of unit pixels and a pixel-array peripheral region located at an outer wall of the pixel region, an over-coating layer disposed over the semiconductor substrate in the pixel region and the pixel-array peripheral region, a lens layer disposed over the over-coating layer in the pixel region, and a lens capping layer disposed over the lens layer and the over-coating layer, and configured in a manner that some regions of the lens capping layer are formed to fill the over-coating layer in the pixel-array peripheral region.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device that may effectively reduce the possibility of the structural failure of lens capping layers, which prevents the flare phenomenon from occurring in a lens layer.

Reference will now be made in detail to certain embodiments, examples of which are illustrated in the accompanying drawings. Wherever possible, the same reference numbers will be used throughout the drawings to refer to the same or similar parts.

Figure 1:
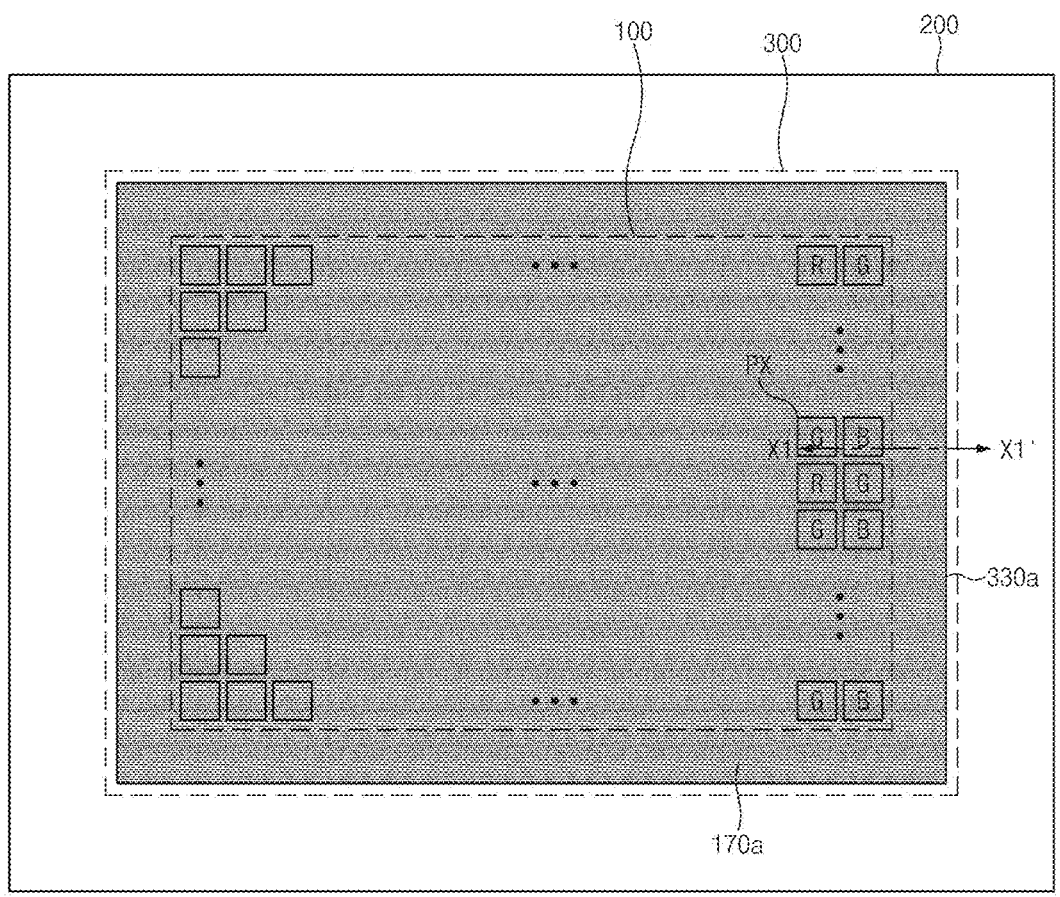
FIG. 1 is a schematic diagram illustrating an example layout of an image sensing device based on some implementations of the disclosed technology.

FIG. 1 is a schematic diagram illustrating an example layout of an image sensing device based on some implementations of the disclosed technology.

In some implementations, the image sensing device may include a pixel region 100, a logic region 200, and a peripheral region 300 of a pixel array (hereinafter referred to as a pixel-array peripheral region 300).

The pixel region 100 may be located at the center of the image sensing device, and may include a plurality of unit pixels PXs arranged in rows and columns in a two-dimensional (2D) matrix array. For example, the plurality of unit pixels PXs may be consecutively arranged in a first direction and a second direction perpendicular to the first direction. The plurality of unit pixels PXs may include red (R) color filters, green (G) color filters, and blue (B) color filters, which may be arranged in a Bayer pattern. The plurality of unit pixels PXs may convert incident light received through the color filters into electrical signals corresponding to the incident light, and may thus generate a pixel signal using the electrical signals.

The pixel region 100 may include a plurality of microlenses arranged over the color filters to converge incident light to a corresponding color filter. Each of the microlenses may be arranged over a corresponding unit pixel PX. A lens capping layer 170a may be disposed over the microlenses to protect microlenses while preventing the flare phenomenon caused by the microlenses. The lens capping layer 170a may be formed to cover the pixel region 100, and may be formed to extend to the pixel-array peripheral region 300. The lens capping layer 170a may include a low temperature oxide (LTO) film. In some implementations, the lens capping layer 170a may include a micro-lens optic (MLO) layer.

The logic region 200 may be located outside the pixel region 100 such as a region surrounding the pixel region 100. The logic region 200 may include a plurality of logic circuits to process electrical signals read out from the unit pixels PXs. The logic region 200 may include a variety of logic circuits, for example, a correlated double sampler (CDS) circuit, an analog-to-digital converter (ADC) circuit, a buffer, a row driver, a timing generator, a ramp signal generator, and/or an image processor. Although FIG. 1 illustrates that the logic region 200 surrounds the pixel region 100, in another implementation, the logic region 200 may also be disposed below the pixel region 100.

The pixel-array peripheral region 300 may be disposed between the pixel region 100 and the logic region 200, and may include a trench 330a to prevent structural damages to the lens capping layer 170a, which may cause the lens capping layer 170a to become disengaged from the substrate and other structures on the substrate. The trench 330a may be formed in an over-coating layer disposed below the lens capping layer 170a. The over-coating layer may be a material layer that is arranged between a color filter layer and a lens layer in the pixel region 100. The material layer may extend to the peripheral region 300 and the logic region 200. That is, the trench 330a may be formed by etching the over-coating layer disposed below the lens capping layer 170a to a predetermined depth. Some regions (e.g., an edge region) of the lens capping layer 170a may extend to fill the trench 330a in the pixel-array peripheral region 300 to prevent structural damages to the lens capping layer 170a. The lens capping layer 170a may be damaged during a wafer back-grinding process or a sawing process. In some embodiments of the disclosed technology, however, such structural damages to the lens capping layer 170a may be minimized by forming the edge region of the lens capping layer 170a in the trench 330a of the over-coating layer. As described above, since the edge region of the lens capping layer 170a is formed in the trench 330a, a contact area between the lens capping layer 170a and the over-coating layer may increase, thereby minimizing the possibility of becoming disengaged from the substrate and other structures on the substrate during the wafer back-grinding process or the sawing process. The edge region of the lens capping layer 170a may be formed to a deep depth in the trench 330a in a manner that the edge region can vertically extend to an inner region of the semiconductor substrate. To this end, the pixel-array peripheral region 300 may further include a trench (not shown) that is formed by etching the semiconductor substrate to a predetermined depth. When seen from above, as a whole, the trench 330a may be formed in a ring shape surrounding the pixel region 100.

Although the drawings illustrate the pixel-array peripheral region 300 as a separate region that is arranged between the pixel region 100 and the logic region 200, it should be noted that the pixel-array peripheral region 300 may be a mere boundary region between the pixel region 100 and the logic region 200. Alternatively, the pixel-array peripheral region 300 may be a portion of the pixel region 100 or a portion of the logic region 200.

Figure 2:
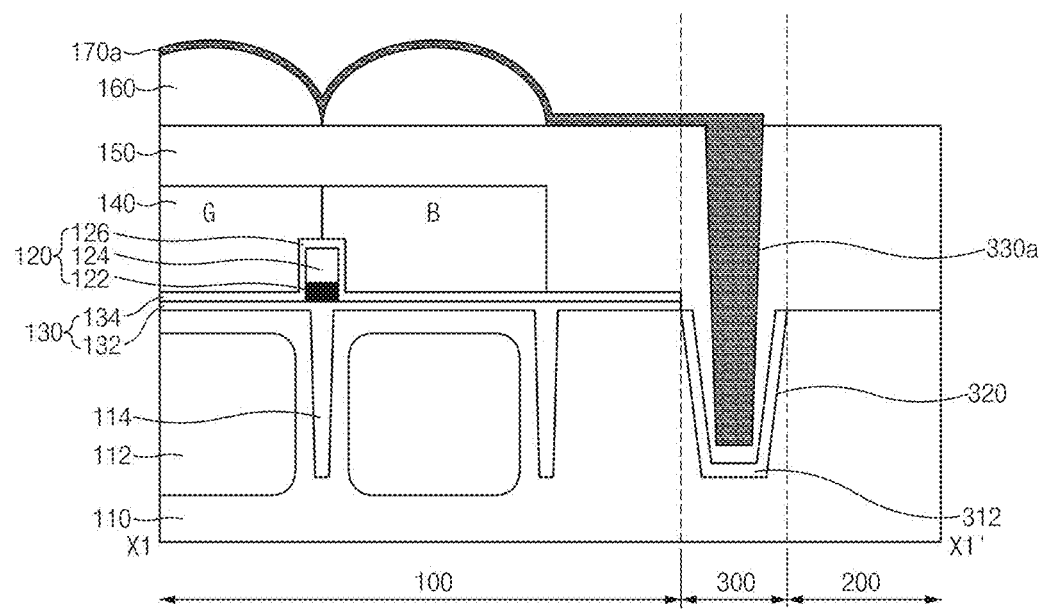
FIG. 2 is a cross-sectional view illustrating an example of the image sensing device taken along the line X1-X1' shown in FIG. 1 based on some implementations of the disclosed technology.

FIG. 2 is a cross-sectional view illustrating an example of the image sensing device taken along the line X1-X1' shown in FIG. 1 based on some implementations of the disclosed technology.

In some implementations, the image sensing device may include a substrate layer 110, a grid structure 120, a buffer layer 130, a color filter layer 140, an over-coating layer 150, a lens layer 160, and a lens capping layer 170a.

The substrate layer 110 may include a semiconductor substrate having a first surface and a second surface facing away from each other. The semiconductor substrate 110 may include a material in a monocrystalline state. In some implementations, the semiconductor substrate 110 may include a silicon-containing material. For example, the semiconductor substrate 110 may include a monocrystalline silicon-containing material. The substrate layer 110 may include one or more photoelectric conversion elements 112. The substrate layer 110 may include one or more device isolation structures 114 to isolate the photoelectric conversion elements 120 from each other. The device isolation structure 114 may be formed in a deep trench isolation (DTI) structure in which at least one of an insulation layer and a low index layer such as an air layer is buried. The semiconductor substrate 110 may include a trench 320 formed in the pixel-array peripheral region 300.

Each of the photoelectric conversion elements 112 may include an organic or inorganic photodiode. Each of the photoelectric conversion elements 112 may include impurity regions vertically stacked in the substrate layer 110. For example, each of the photoelectric conversion elements 112 may include a photodiode in which an N-type impurity region and a P-type impurity region are vertically stacked on top of each other.

The grid structure 120 may be formed over the first surface of the substrate layer 110, and may be disposed at a boundary region between adjacent color filters (e.g., red color, green color, blue color "RGB" color filters) in the color filter layer 140, thereby preventing optical crosstalk between the RGB color filters. The grid structure 120 may include a hybrid structure indicating a stacked structure of a metal layer 122 and a low-refractivity material layer 124. In this case, the metal layer 122 may include tungsten (W), and the low-refractivity material layer 124 may include the low index layer such as the air layer. The grid structure 120 may include a capping film 126 formed to cover the metal layer 122 and the low-refractivity material layer 124. The capping film 126 may include a multilayer structure including an oxide film. For example, the capping film 126 may be formed of a double oxide film (or two oxide films) or may be formed of a multilayer structure formed by stacking an oxide film and other material films different from the oxide film. In some implementations, the capping film 126 may include an ultra low temperature oxide (ULTO) film such as a silicon oxide film ($SiO_2$).

The buffer layer 130 may be formed over the first surface of the substrate layer 110, and may operate as a planarization layer for planarization of the layers formed over the first surface of the substrate layer 110. In addition, the buffer layer 130 may operate as an anti-reflection layer to allow incident light received through the color filter layer 140 to penetrate the photoelectric conversion elements 112 of the substrate layer 110. The buffer layer 130 may include a multilayer structure formed by stacking different materials having different refractive indices. For example, the buffer layer 130 may include a multilayer structure formed by stacking a nitride film 132 and an oxide film 134 on top of one another. The nitride film 132 may be formed simultaneously with formation of the device isolation structure 114. In addition, the nitride film 132 may be formed simultaneously with formation of an insulation layer 312 disposed over an inner surface (i.e., a side surface and a bottom surface) of the trench 320. The oxide film 134 may include a monolayer structure formed of any one of an undoped silicate glass (USG) film and an ultra low temperature oxide (ULTO) film, or may include a multilayer structure formed by stacking the USG film and the ULTO film. The oxide film 134 may be formed simultaneously with formation of the capping film 126 of the grid structure 120.

The color filter layer 140 may include the plurality of color filters (e.g., RGB color filters), each of which is formed to selectively transmit visible light at a certain wavelength while blocking light at other wavelengths. The color filters may be formed per unit pixel (PX). For example, the color filter layer 140 may include a plurality of red color filters (Rs), a plurality of green color filters (Gs), and a plurality of blue filters (Bs). Each red color filter (R) may transmit only light in red wavelength regions of visible light. Each green color filter (G) may transmit only light in green wavelength regions of visible light. Each blue filter (B) may transmit only light in blue wavelength regions of visible light. The red color filters (Rs), the green color filters (Gs), and the blue color filters (Bs) may be arranged in a Bayer pattern. Alternatively, the color filter layer 140 may include a plurality of cyan filters, a plurality of yellow filters, and a plurality of magenta filters.

The over-coating layer 150 may be formed over the color filter layer 140 to remove or reduce a step difference caused by the color filter layer 140. In some implementations, the over-coating layer 150 may be formed in the pixel region 100, the logic region 200, and the pixel-array peripheral region 300. The over-coating layer 150 may include a trench 330a formed in the pixel-array peripheral region 300. A portion of the lens capping layer 170a may be formed in the trench 330a. In some implementations, the trench 330a in the over-coating layer 150 is filled with the lens capping layer 170a such that the edge region of the lens capping layer 170a is buried in the over-coating layer 150. As described above, since the edge region of the lens capping layer 170a is formed in the trench 330a, the contact area of the lens capping layer 170a to the over-coating layer 150 may be increased or maximized, thereby minimizing structural damages of the lens capping layer 170a during a wafer back-grinding process or a sawing process.

The lens layer 160 may be formed over the over-coating layer 150, and may include a plurality of microlenses to converge incident light. Each of the microlenses may correspond to one unit pixel.

The lens capping layer 170a may be formed over the lens layer 160 and the over-coating layer 150, and may prevent the flare phenomenon caused by the microlenses. The lens capping layer 170a may be formed over the lens layer 160 of the pixel region 100 and extend to over the pixel-array peripheral region 300. Specifically, the edge region of the lens capping layer 170a may be buried to a predetermined depth in the over-coating layer 150 contained in the pixel-array peripheral region 300. For example, the edge region of the lens capping layer 170a may extend into the trench 330a formed in the over-coating layer 150. In some implementations, the edge region of the lens capping layer 170a formed in the over-coating layer 150 may vertically extend into the semiconductor substrate 110. For example, the bottom surface of the edge region of the lens capping layer 170a may be located below the first surface of the semiconductor substrate 110 in a vertical direction.

Figure 3:
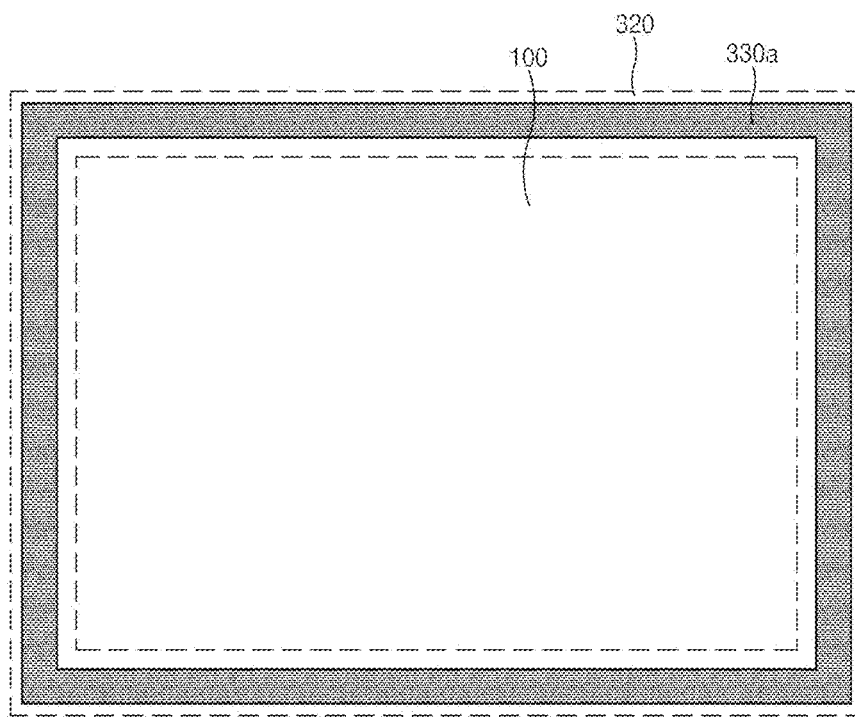
FIG. 3 is a schematic diagram illustrating an example layout of an over-coating layer and a plurality of trenches formed in a semiconductor substrate shown in FIG. 1 based on some implementations of the disclosed technology.

In some implementations, by extending the vertical edge region of the lens capping layer 170a as discussed above, the structural damages to the lens capping layer 170a may be further prevented. Therefore, the trench 320 may also be formed in the semiconductor substrate 110 of the pixel-array peripheral region 300, such that the trench 330a of the over-coating layer 150 extends to a predetermined depth in the semiconductor substrate 110 of the pixel-array peripheral region 300 to form the trench 320, and thus the depth of the edge region of the lens capping layer 170a can be extended to the inner region of the semiconductor substrate 110. FIG. 3 is a schematic diagram illustrating an example layout of trenches 320 and 330a. A horizontal cross-section of the trenches 320 and 330a may be formed in a rectangle shape or a ring shape surrounding the pixel region 100 in a manner that horizontal cross-sectional views of both sidewalls arranged to face each other can be formed flat.

Although FIG. 2 illustrates the trench 330a as extending to form the trench 320 in the semiconductor substrate 110 by way of example, it should be noted that the trench 320 may not be formed in another implementation.

In addition, although FIG. 2 illustrates the logic region 200 as being formed in the same substrate 110 as the pixel region 100 and outside the pixel region 100 by way of example, it should be noted that the logic region 200 may also be formed below the substrate 110.

Figure 4:
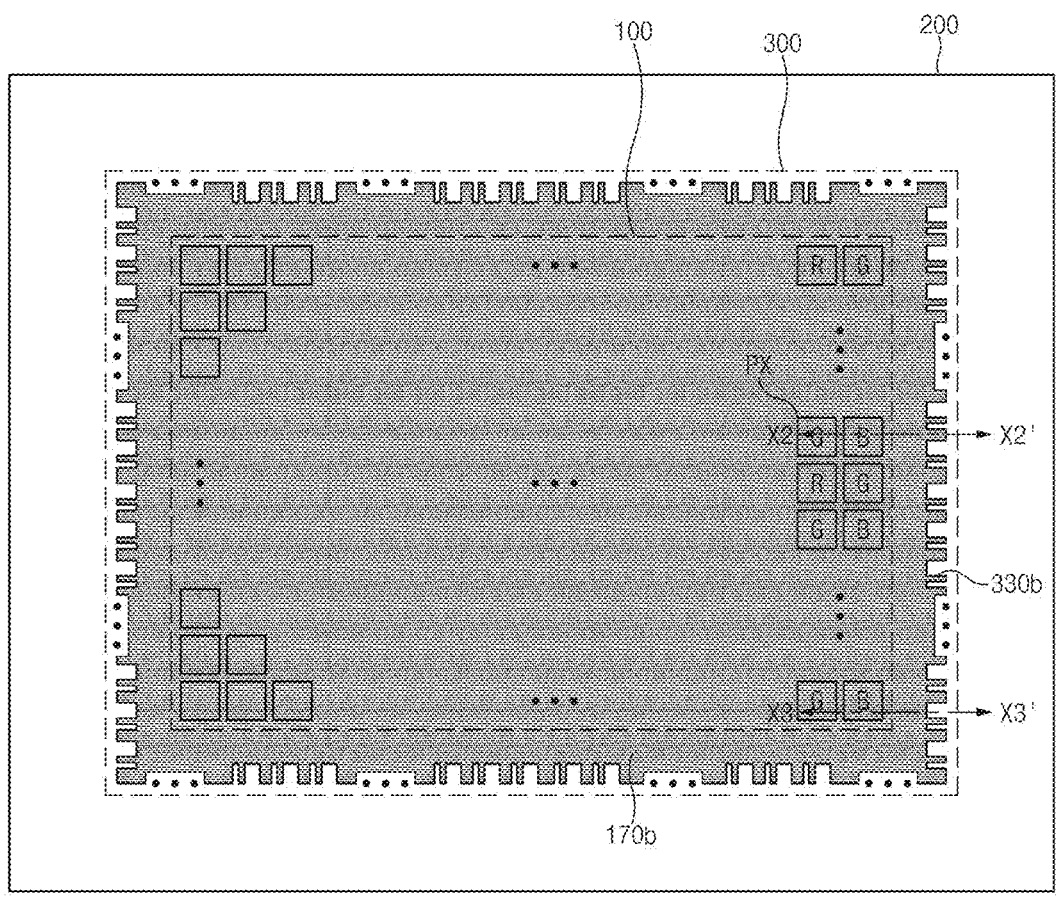
FIG. 4 is a schematic diagram illustrating an example layout of an image sensing device based on some other implementations of the disclosed technology.
Figure 5A:
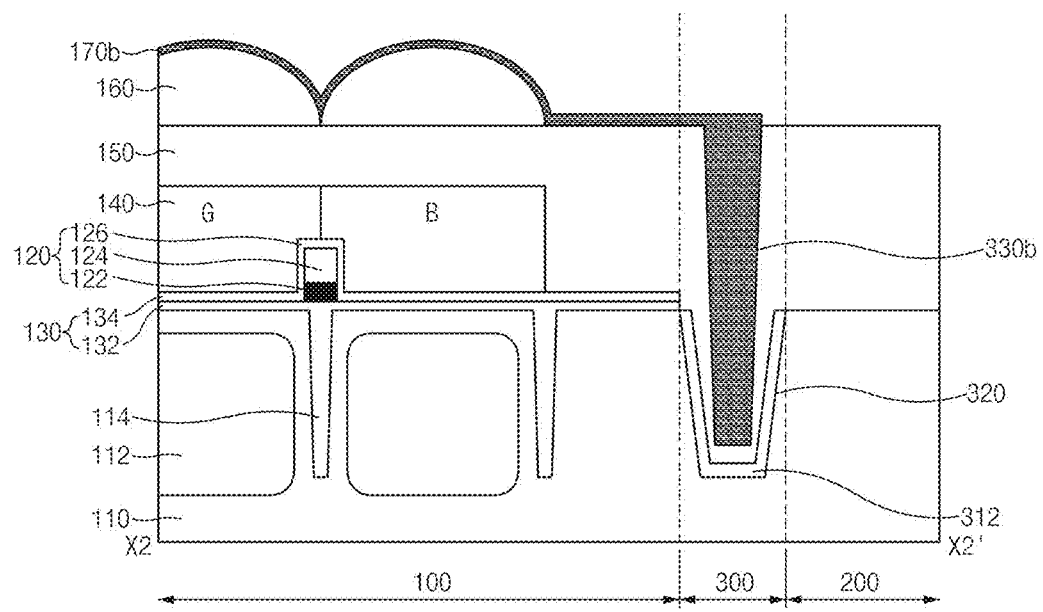
FIG. 5A is a cross-sectional view illustrating an example of the image sensing device taken along the line X2-X2' shown in FIG. 4 based on some other implementations of the disclosed technology.
Figure 5B:
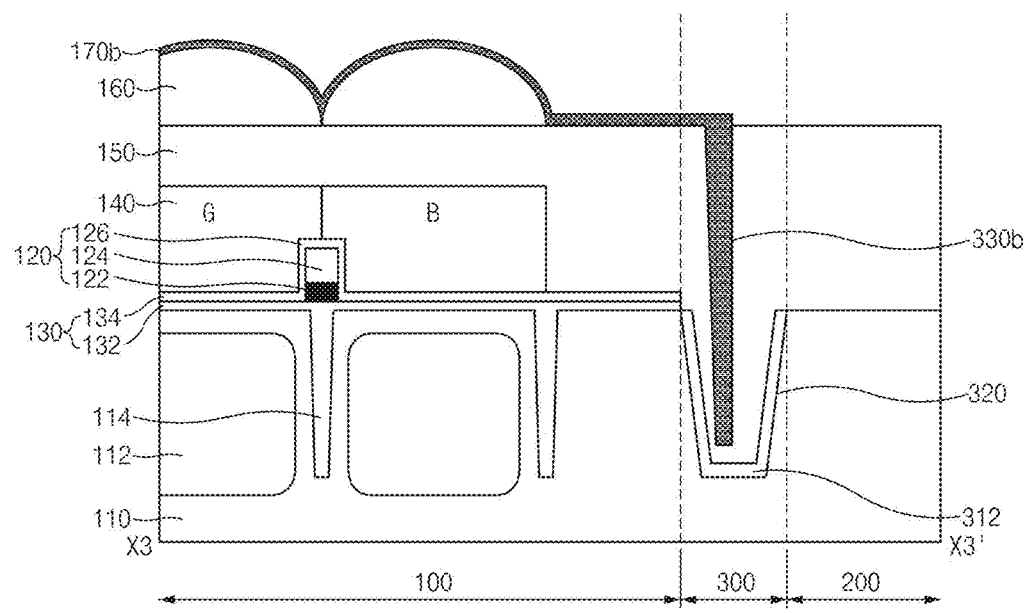
FIG. 5B is a cross-sectional view illustrating an example of the image sensing device taken along the line X3-X3' shown in FIG. 4 based on some other implementations of the disclosed technology.

FIG. 4 is a schematic diagram illustrating an example layout of the image sensing device based on some other implementations of the disclosed technology. FIG. 5A is a cross-sectional view illustrating an example of the image sensing device taken along the line X2-X2' shown in FIG. 4 based on some other implementations of the disclosed technology. FIG. 5B is a cross-sectional view illustrating an example of the image sensing device taken along the line X3-X3' shown in FIG. 4 based on some other implementations of the disclosed technology.

The layout shown in FIG. 4 and the cross-sectional structure shown in FIGS. 5A and 5B are similar in many respects to the layout shown in FIG. 1 and the cross-sectional structure shown in FIG. 2, respectively, and the following description will focus primarily on the distinctions. In the following description, for convenience of description, but not limitation, some items described previously with reference to FIG. 1 will hereinafter be denoted by the same reference numbers, and items with the same reference numbers may have the same or similar features. Referring to FIGS. 4, 5A, and 5B, the image sensing device may include a lens capping layer 170*b* that is formed over the lens layer 160 and extends to the pixel-array peripheral region 300. In this case, a horizontal cross-section of the edge region of the lens capping layer 170*b* may have a serrated shape. For example, the lens capping layer 170*b* may have a series of protruding, rectangular shaped teeth along the edge of the lens capping layer 170*b*. That is, unlike the lens capping layer 170*a* shown in FIG. 1, the lens capping layer 170*b* may be formed in a serrated shape.

The edge region of the lens capping layer 170*b* may be formed in the trench 330*b* that is formed by etching of the over-coating layer 150. The trench 330*b* may be formed to a predetermined depth extending to the inner region of the trench 320 formed in the semiconductor substrate 110.

Figure 6:
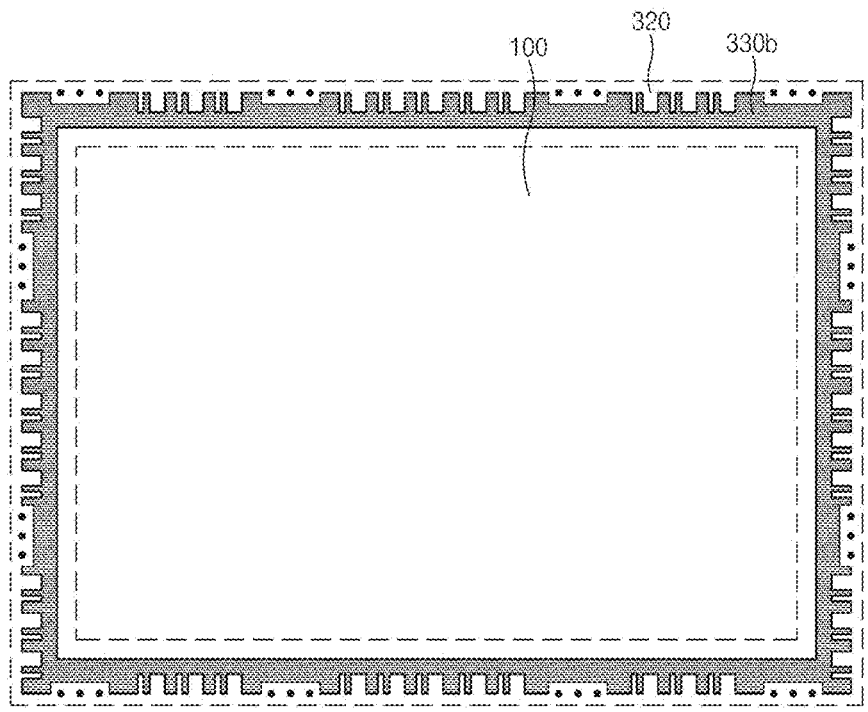
FIG. 6 is a schematic diagram illustrating an example layout of an over-coating layer and a plurality of trenches formed in a semiconductor substrate shown in FIG. 4 based on some other implementations of the disclosed technology.

FIG. 6 is a schematic diagram illustrating an example layout of trenches 320 and 330*b*. Each of the trenches 320 and 330*b* may be formed in a rectangle shape or a ring shape surrounding the pixel region 100. In some embodiments of the disclosed technology, a horizontal cross-section of the trench 320 may have a flat side or outline, and a horizontal cross-section of the trench 330*b* arranged over the trench 320 may have serrated sides with a series of protruding, rectangular shaped teeth.

In some implementations, the edge line of the lens capping layer 170*b* based on some implementations of the disclosed technology is formed in the trench 330*b* formed in a serrated shape by filling the trench 330*b* with the edge region of the lens capping layer 170*b*.

As described above, when the edge region of the lens capping layer 170*b* is formed in the trench 330*b* in a serrated shape, the contact area of the lens capping layer 170*b* to the over-coating layer 150 can be larger in size than the contact area shown in FIG. 1. Therefore, the image sensing device based on some embodiments of the disclosed technology can improve the structural stability of the lens capping layer 170*b*.

FIGS. 7A, 8A, 9A, 10A, and 11A are cross-sectional views illustrating examples of a method for forming the structure shown in FIG. 5A based on some implementations of the disclosed technology. FIGS. 7B, 8B, 9B, 10B, and 11B are cross-sectional views illustrating examples of a method for forming the structure shown in FIG. 5B based on some implementations of the disclosed technology.

Figure 7A:
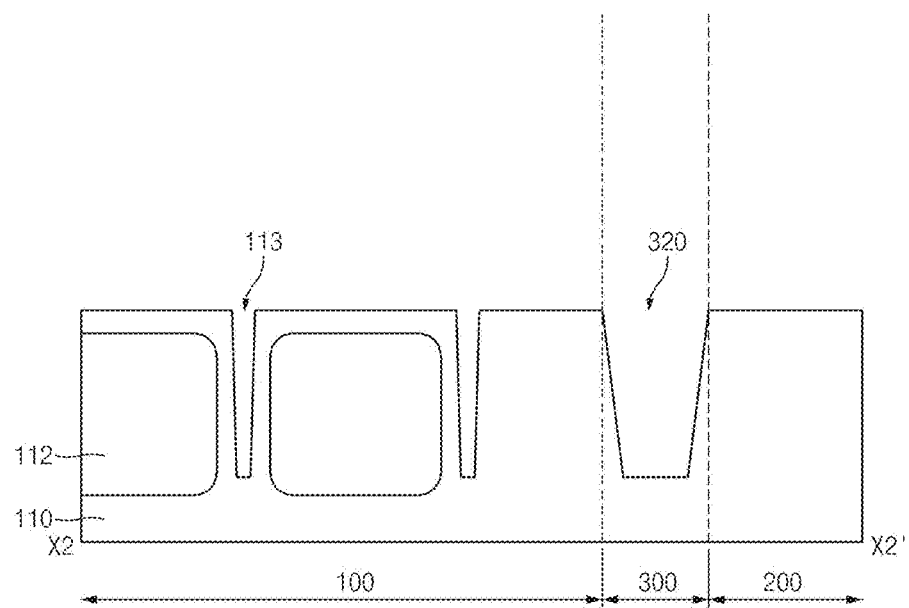
FIGS. 7A, 8A, 9A, 10A, and 11A are cross-sectional views illustrating examples of a method for forming the structure shown in FIG. 5A based on some implementations of the disclosed technology.
Figure 7B:
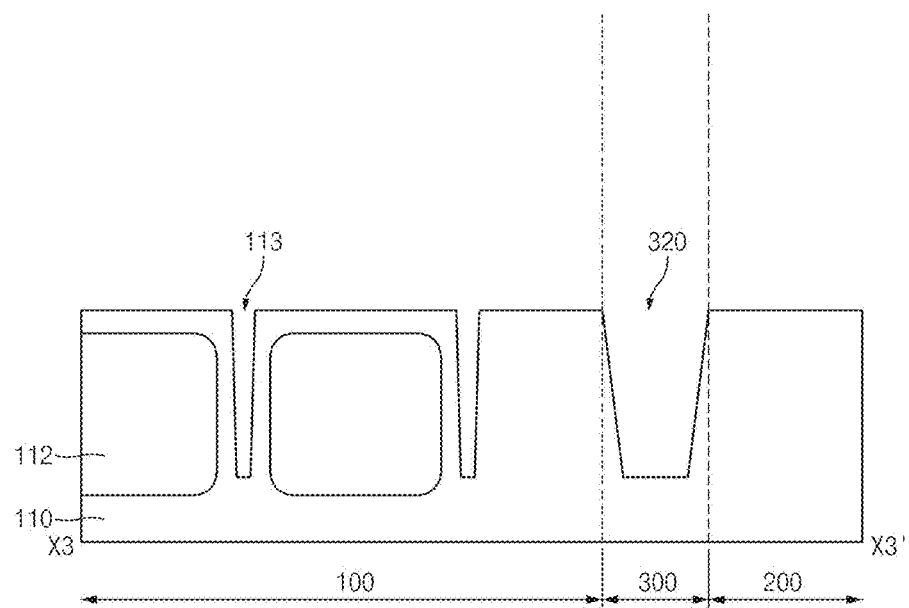
FIGS. 7B, 8B, 9B, 10B, and 11B are cross-sectional views illustrating examples of a method for forming the structure shown in FIG. 5B based on some implementations of the disclosed technology.

Referring to FIGS. 7A and 7B, the photoelectric conversion elements 112 may be formed in the unit pixel regions by implanting impurities in the semiconductor substrate 110 of the pixel region 100.

Subsequently, the semiconductor substrate 110 may be etched in a manner that the trench 113 defining the unit pixel PX region is formed in the pixel region 100 and at the same time the trench 320 formed to surround the pixel region 100 in a rectangle shape or a ring shape shown in FIG. 6 can be formed in the pixel-array peripheral region 300.

In some implementations, a horizontal cross-section of the trench 320 may have flat sides. For example, the trench 320 may be formed to have substantially the same depth as the trench 113. The trench 320 may also be formed to have substantially the same width in its entirety.

Figure 8A:
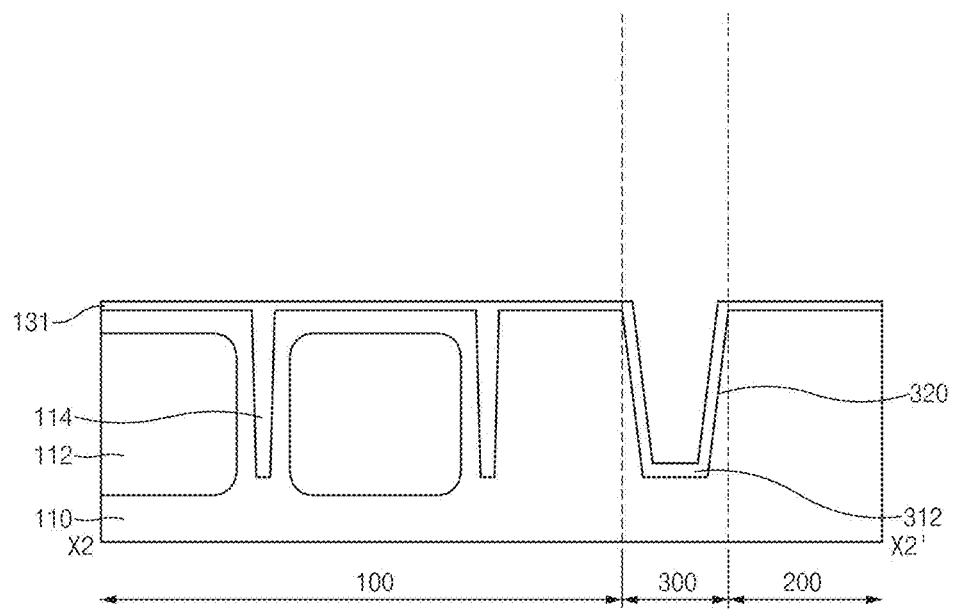
Figure 8B:
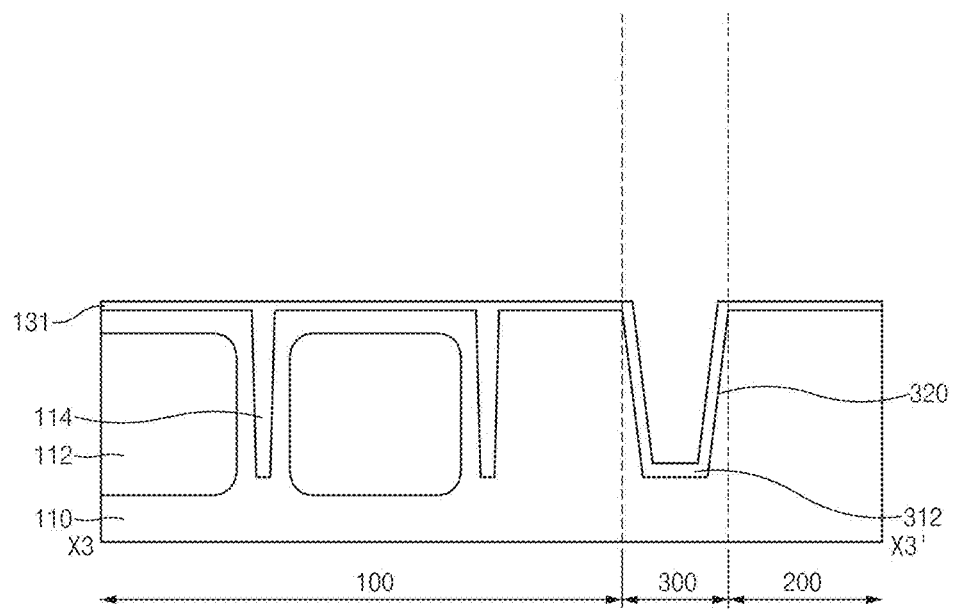

Referring to FIGS. 8A and 8B, an insulation material 131 may be formed over the semiconductor substrate in which trenches 113 and 320 are formed. In this case, the insulation material 131 may be formed to fill the trench 113, resulting in formation of a device isolation structure 114.

In some implementations, the trench 320 may be formed to have a larger width than the trench 113, such that the trench 320 is partially filled with the insulation material 131, e.g., the insulation material 131 is only formed at inner sidewalls and a bottom surface of the trench 320. The insulation material 131 may include a nitride material.

The insulation material 131 formed over the semiconductor substrate 110 in the pixel region 100 may be used as the nitride film 132 of the buffer layer 130.

Figure 9A:
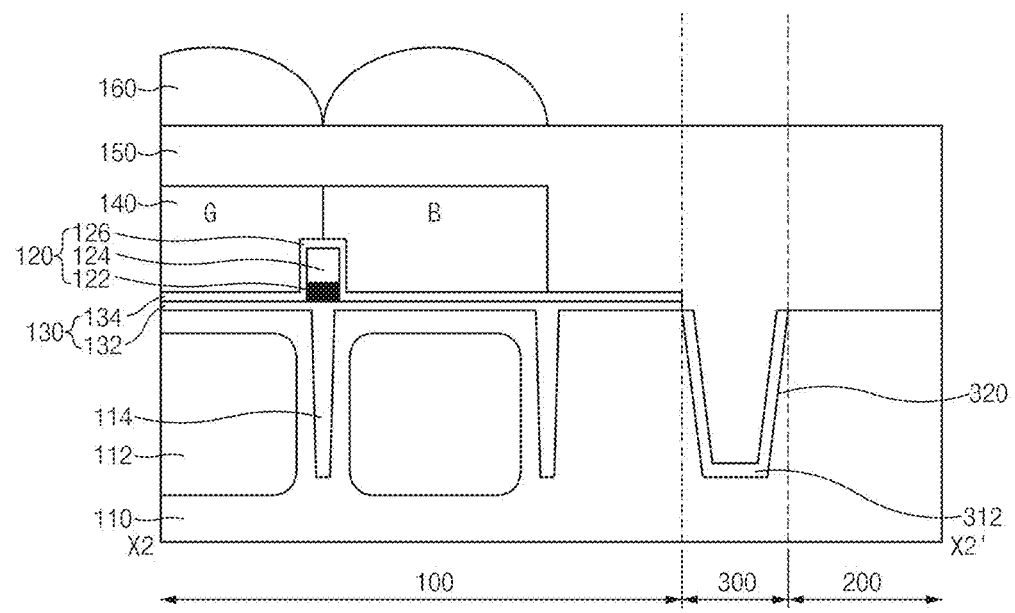
Figure 9B:
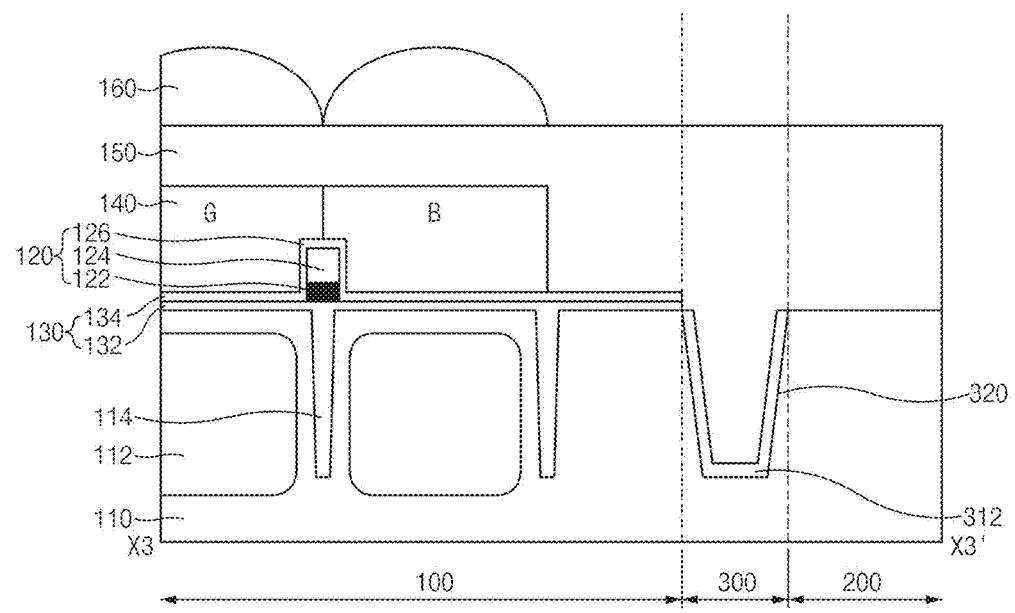

Referring to FIGS. 9A and 9B, the grid structure 120 and the oxide film 134 of the buffer layer 130 may be formed over the insulation material 131 in the pixel region 100.

For example, a metallic material and a low-refractivity material may be sequentially formed over the insulation material 131, and may then be patterned, such that a stacked structure of the metal layer 122 and the low-refractivity material layer 124 contained in the grid structure 120 can be formed over the device isolation structure 114. Subsequently, after the insulation material (e.g., an oxide material) 134 is formed over the insulation material 131 and the stacked structure of the metal layer 122 and the low-refractivity material layer 124, the insulation materials 131 and 134 formed in the logic region 200 may be removed leaving only the insulation material 312 formed in the trench 320.

The color filter layer 140 may be formed over the buffer layer 130 in the pixel region 100.

Subsequently, the over-coating layer 150 may be formed in the pixel region 100, the logic region 200, and the pixel-array peripheral region 300 to cover the color filter layer 140. In this case, the over-coating layer 150 may be formed to fill (or bury) the trench 320 of the pixel-array peripheral region 300.

Thereafter, the lens layer 160 may be formed over the over-coating layer 150 of the unit pixel (PX) region in the pixel region 100. For example, each microlens may be formed per unit pixel (PX).

Figure 10A:
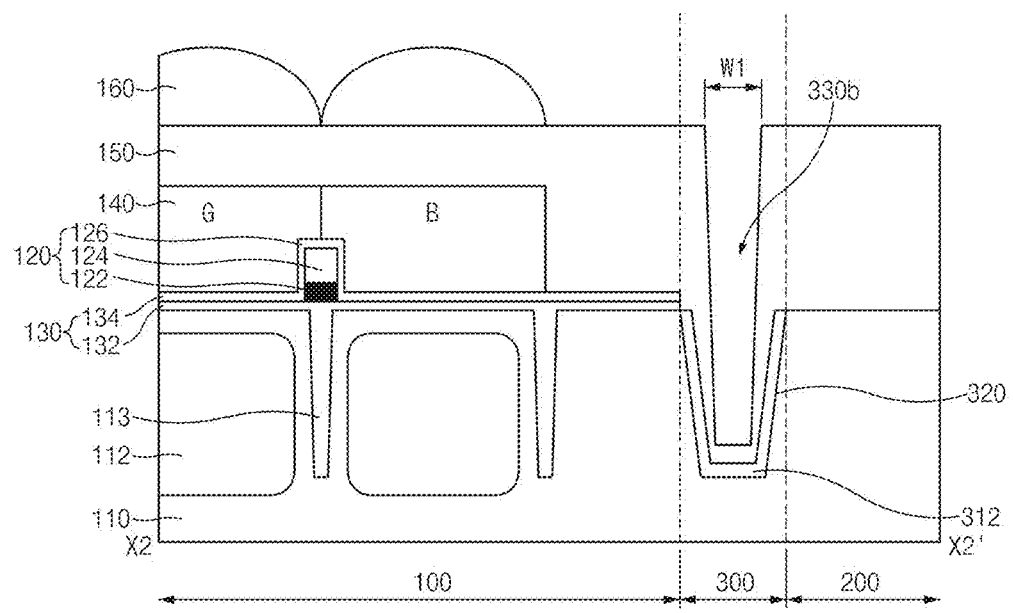
Figure 10B:
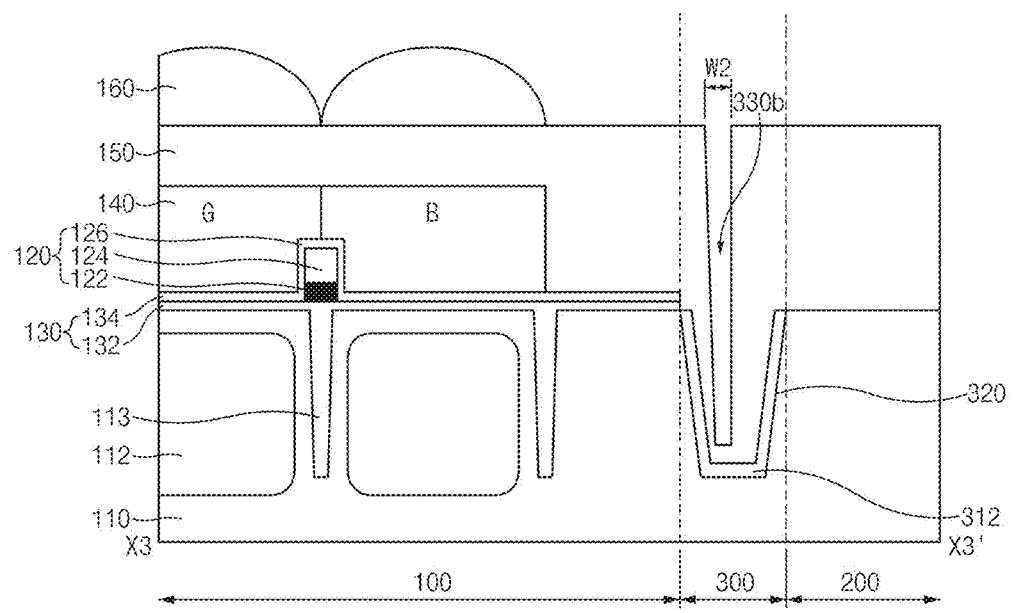

Referring to FIGS. 10A and 10B, the trench 330*b* may be formed by etching the over-coating layer 150 of the pixel-array peripheral region 300.

For example, after a mask pattern (i.e., a photoresist pattern) defining the trench 330*b* is formed over the over-coating layer 150, the over-coating layer 150 may be etched using the mask pattern as an etch mask to form the trench 330b. In this case, as shown in FIG. 6, the trench 330b may be arranged to surround the pixel region 100 such that a horizontal cross-section of the region of the trench 330b has sides with a series of protruding, rectangular shaped teeth as shown in FIGS. 4 and 6. In another implementation, the horizontal cross-section of the trench 330b has sides have a series of protruding, triangular shaped teeth. That is, sidewalls of the trench 330b may be form uneven, and, for example, sidewalls of the trench 330b may have a wide region having a large width W1 as shown in FIG. 10A and a narrow region having a small width W2 as shown in FIG. 10B.

In addition, the bottom surface of the trench 330b may be formed to extend to the inner region of the trench 320.

Figure 11A:
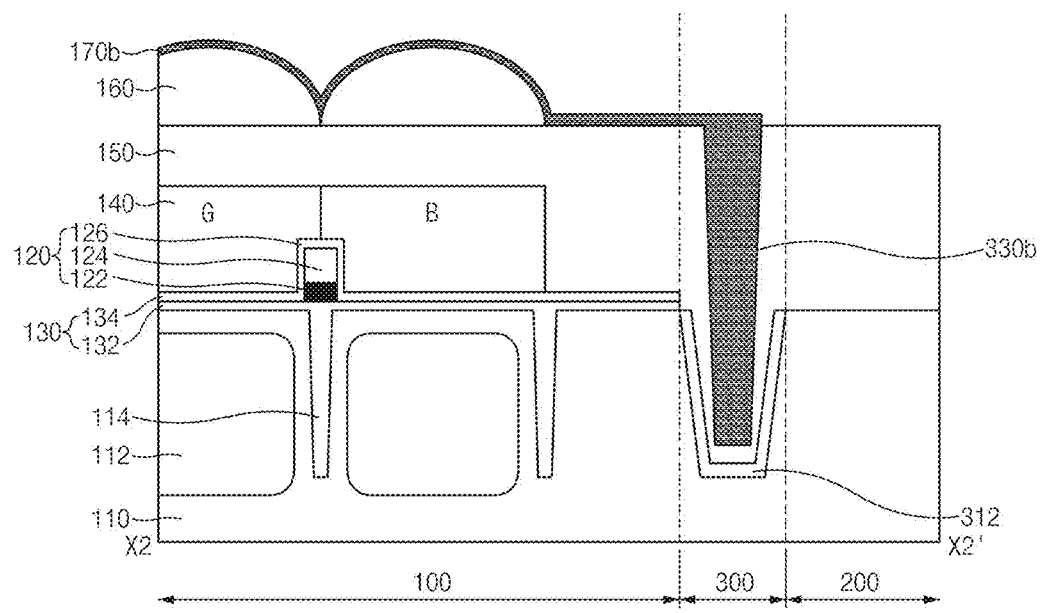
Figure 11B:
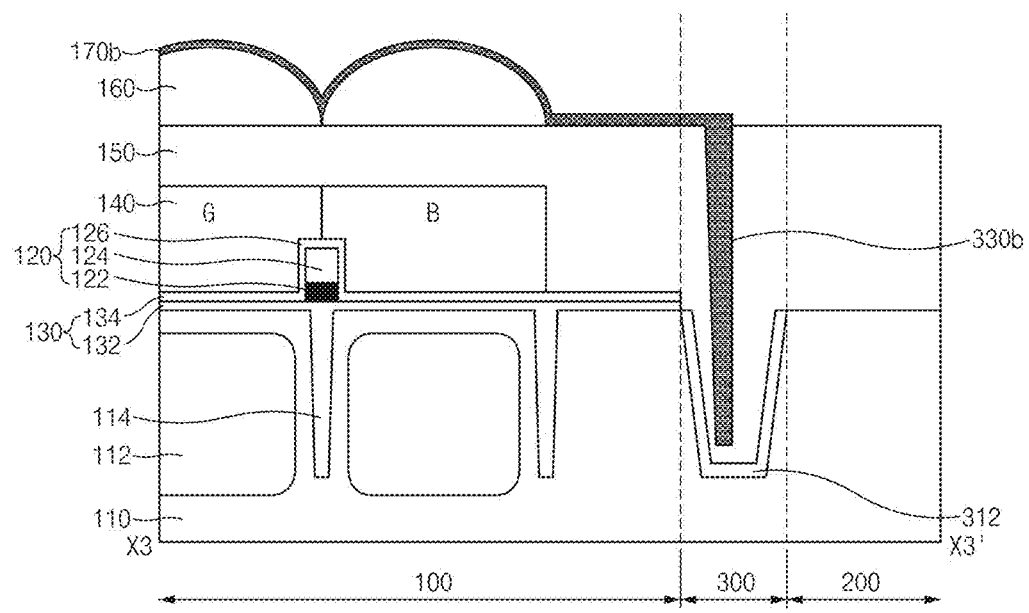

Referring to FIGS. 11A and 11B, the lens capping layer 170b may be formed over the lens layer 160. In this case, the lens capping layer 170b may be formed to extend to the pixel-array peripheral region 300, and may be formed in the trench 330b. That is, the edge region of the lens capping layer 170b may be formed to fill the trench 330b.

Figure 12:
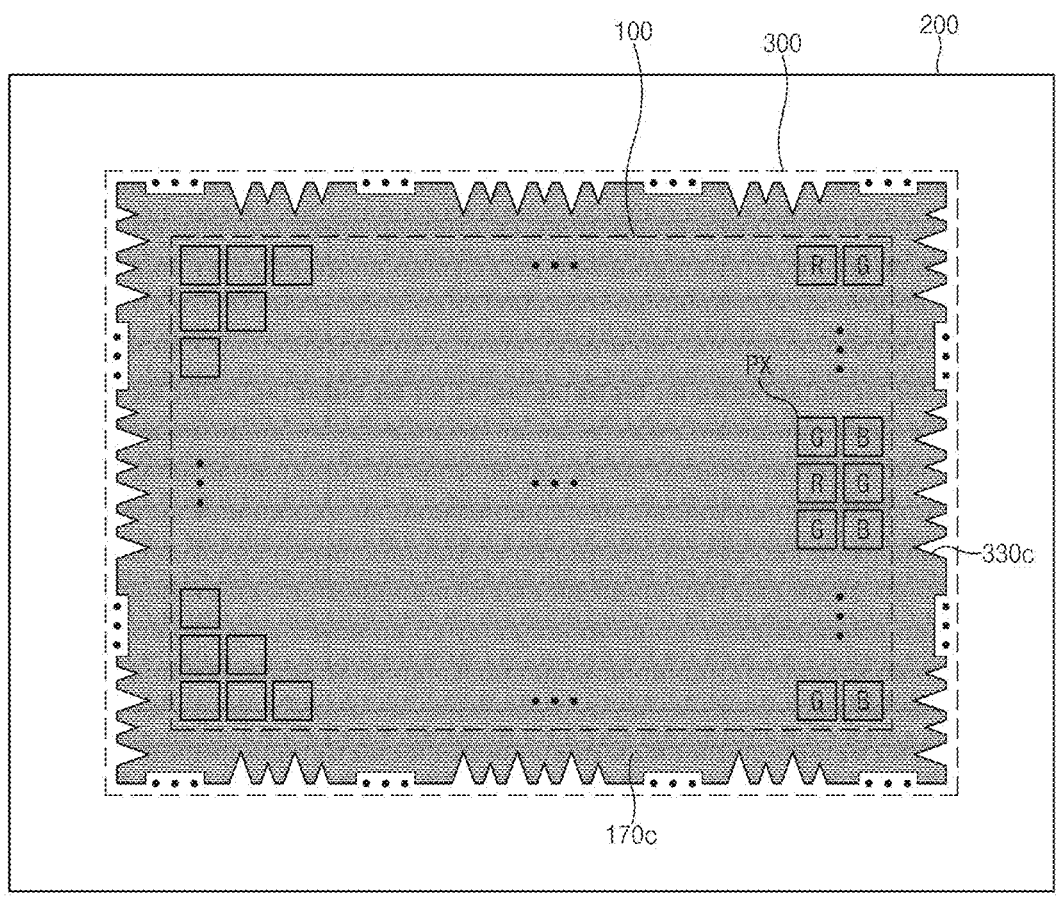
FIG. 12 is a schematic diagram illustrating an example layout of an image sensing device based on some other implementations of the disclosed technology.

FIG. 12 is a schematic diagram illustrating an example layout of the image sensing device based on some implementations of the disclosed technology.

Referring to FIG. 12, the layout of the image sensing device may be different in its edge line shape of the lens capping layer as compared to the image sensing device shown in FIG. 4.

For example, an edge region of a lens capping layer 170c may be formed to a predetermined depth in the over-coating layer 150 formed in the pixel-array peripheral region 300. In addition, the lens capping layer 170c may have serrated edge lines with a series of protruding, triangular shaped teeth.

As illustrated in FIGS. 10A and 10B, such serrated edge lines of the lens capping layer 170c may be formed by forming the trench 330c having sidewalls with serrated surfaces.

As is apparent from the above description, the image sensing device based on some implementations of the disclosed technology can effectively reduce or minimize structural failures that would have occurred at the lens capping layer for addressing the flare phenomenon at the lens layer.

Only examples of limited embodiments are disclosed. Variations or modifications of the disclosed embodiments and examples and other embodiments can be made based on what is disclosed in this patent document.

What is claimed is:

1. An image sensing device comprising:
a semiconductor substrate structured to include a pixel region, which includes a plurality of unit pixels, and a pixel-array peripheral region located outside of and peripheral to the pixel region;
a material layer disposed over the semiconductor substrate in the pixel region and the pixel-array peripheral region, and structured to include a first trench extending to a predetermined depth in the pixel-array peripheral region;
a lens layer disposed over the material layer in the pixel region and structured as a lens for collecting incident light into a unit pixel in the pixel region; and
a lens capping layer disposed over the lens layer and the material layer and structured to include an edge region formed to fill the first trench.

2. The image sensing device according to claim 1, wherein the first trench is arranged to surround the pixel region.

3. The image sensing device according to claim 1, wherein a horizontal cross-section of the first trench has a side including one or more protruding portions.

4. The image sensing device according to claim 1, wherein a horizontal cross-section of the first trench has a serrated side.

5. The image sensing device according to claim 1, wherein the pixel-array peripheral region further includes a second trench formed in the semiconductor substrate to a predetermined depth.

6. The image sensing device according to claim 5, wherein the first trench is formed to extend to a predetermined depth in the second trench.

7. The image sensing device according to claim 5, wherein the second trench is arranged to surround the pixel region.

8. The image sensing device according to claim 5, wherein a horizontal cross-section of the second trench has flat sides.

9. The image sensing device according to claim 5, wherein the second trench is formed to have a larger width than the first trench.

10. The image sensing device according to claim 1, wherein the lens capping layer includes a low temperature oxide (LTO) film.

11. An image sensing device comprising:
a semiconductor substrate structured to include a pixel region, which includes a plurality of unit pixels, and a pixel-array peripheral region outside the pixel region;
an over-coating layer disposed over the semiconductor substrate in the pixel region and the pixel-array peripheral region, where the over-coating layer is structured to include regions extending to a predetermined depth in the semiconductor substrate;
a lens layer disposed over the over-coating layer in the pixel region; and
a lens capping layer disposed over the lens layer and the over-coating layer, and structured to include regions extending inside the over-coating layer in the pixel-array peripheral region.

12. The image sensing device according to claim 11, wherein the lens capping layer is structured to include an edge region extending to a predetermined depth in the over-coating layer.

13. The image sensing device according to claim 12, wherein the edge region is extending to a predetermined depth in the semiconductor substrate.

14. The image sensing device according to claim 11, wherein the lens capping layer is buried to vertically extend to an inner region of the semiconductor substrate.

15. The image sensing device according to claim 11, wherein the over-coating layer includes a trench extending to a predetermined depth in the pixel-array peripheral region.

16. An image sensing device comprising:
an imaging pixel array including a plurality of imaging pixels structured to convert optical images to electrical signals;
a material layer disposed over the plurality of imaging pixels and extending to outside the imaging pixel array;
a lens layer including a plurality of lenses disposed over the material layer and structured to converge light onto the plurality of imaging pixels; and
a lens capping layer including a first portion and a second portion, the first portion being disposed over the lens layer, the second portion extending from the first portion and being vertically elongated in the material layer formed outside the imaging pixel array, wherein at least part of the imaging pixel array is formed in a semiconductor substrate, and wherein the material layer is disposed over the semiconductor substrate and includes a trench formed outside the imaging pixel array and extending to a predetermined depth in the semiconductor substrate.

17. The image sensing device according to claim 16, wherein a horizontal cross-section of the second portion of the lens capping layer has portions protruding from the first portion of the lens capping layer.

18. The image sensing device according to claim 16, wherein the second portion includes a series of protruding, rectangular shaped teeth along an edge of the lens capping layer.

19. The image sensing device according to claim 16, wherein the second portion includes a series of protruding, triangular shaped teeth along an edge of the lens capping layer.

* * * * *